(12) United States Patent
Perry

(10) Patent No.: US 7,102,437 B2
(45) Date of Patent: Sep. 5, 2006

(54) INTEGRATED CIRCUIT DEVICE

(75) Inventor: Colin Perry, Swindon (GB)

(73) Assignee: Zarlink Semiconductor Limited, Wiltshire (GB)

(*) Notice: Subject to any disclaimer, the term of this patent is extended or adjusted under 35 U.S.C. 154(b) by 36 days.

(21) Appl. No.: 10/936,877

(22) Filed: Sep. 9, 2004

(65) Prior Publication Data
US 2005/0231283 A1 Oct. 20, 2005

(30) Foreign Application Priority Data
Oct. 1, 2003 (GB) ................. 0323021.6

(51) Int. Cl.
H03F 3/45 (2006.01)
(52) U.S. Cl. ...................... 330/259; 330/261
(58) Field of Classification Search ............ 330/254, 330/290, 259, 283, 295; 327/359
See application file for complete search history.

(56) References Cited

U.S. PATENT DOCUMENTS

| 5,670,912 | A | | 9/1997 | Zocher |
| 5,859,558 | A | | 1/1999 | Chen et al. |
| 5,892,400 | A | | 4/1999 | van Saders et al. |
| 6,034,568 | A | * | 3/2000 | Bonaccio et al. ........... 330/253 |
| 6,111,464 | A | | 8/2000 | Laureanti |
| 6,255,910 | B1 | | 7/2001 | Forstner |
| 6,344,762 | B1 | * | 2/2002 | Prentice ....................... 327/65 |
| 6,396,356 | B1 | | 5/2002 | Mehta et al. |

FOREIGN PATENT DOCUMENTS

| GB | 1095605 | | 12/1967 |
| GB | 2338128 | | 12/1999 |
| GB | 2 384 125 | A | 7/2003 |
| GB | 2 386 775 | A | 9/2003 |
| GB | 0327284.6 | | 6/2004 |
| GB | 0327285.3 | | 6/2004 |
| JP | 57210715 | | 6/1981 |
| JP | 61258508 | | 5/1985 |
| JP | 08340214 | | 6/1995 |
| JP | 2001352218 | | 6/2000 |

* cited by examiner

Primary Examiner—Robert Pascal
Assistant Examiner—Hieu Nguyen
(74) Attorney, Agent, or Firm—Dority & Manning, P.A.

(57) ABSTRACT

An integrated circuit device includes an amplifier stage comprising a pair of transistors (134A, 134B), the respective bases or gates of which are connected together, as well as the respective emitters or sources. The respective drains or collectors of the transistors are capacitively coupled (166) so as to be effectively shorted at the frequencies of operation of the amplifier, A biasing circuit arrangement (144) is also provided which employs bias control feedback to set the bias currents for the transistors. The biasing circuit arrangement takes as its input the current flowing at one of the electrodes (160) of one of the transistors.

19 Claims, 2 Drawing Sheets

INTEGRATED CIRCUIT DEVICE

CROSS-REFERENCE TO RELATED APPLICATIONS

The present application claims priority to currently pending United Kingdom Patent Application number 0323021.6, filed Oct. 1, 2004.

STATEMENT REGARDING FEDERALLY SPONSORED RESEARCH OR DEVELOPMENT

N/A

BACKGROUND OF THE INVENTION

This invention relates to an integrated circuit device including a transistor amplifier stage with a biasing circuit arrangement. A particular application of the invention in its preferred form is as a low voltage radio frequency (RF) amplifier for providing differential outputs to a mixer stage.

British Patent Application No. GB2331418A discloses an integrated circuit device having a low voltage single-ended to differential amplifier stage which forms a driver stage for an RF mixer stage having differential signal inputs. The amplifier stage has first and second bipolar transistors each of which is connected to the single-ended input, one connected as a common-base amplifier, and the other as a common-emitter amplifier. The differential outputs to the mixer are produced on the collector electrodes of the transistors. Both transistors have their base-emitter junctions forward-biased using a biasing circuit arrangement comprising a constant current source and a third transistor which is connected to the base electrodes of the first and second transistors via respective series resistances. Inductances in the emitter circuits of the first and second transistors provide a measure of inductive degeneration and allow the emitter electrodes to operate at a potential very close to that of the associated supply rail, maximizing the proportion of the supply voltage which is available to the rest of the circuit. The amplifier stage requires connection of an external choke between the input and ground terminals of the device to provide a DC path to ground for the emitter electrode of the common-base amplifier.

This known device has a number of disadvantages relating to the DC biasing of the amplifier stage. One difficulty is that there is a DC voltage drop associated with the DC current path formed by the integrated circuit bond wires between the device chip and the integrated circuit device terminals for the single-ended input, as well as associated printed circuit board (PCB) tracks and the external choke referred to above, when present. This means that the biasing of the first and second transistors is partly dependent on device manufacturing and PCB implementation, variables.

Another disadvantage is one associated with the need to maintain a low reference bias current in order to minimize power consumption, Typically, the biasing circuit arrangement is implemented as a current mirror. On-chip spiral inductors in the emitter circuits of the first and second transistors often have enough series resistance to the extent that they need to be taken into account in the current mirror reference diode. The desire to keep the reference current low in these circumstances necessitates a large silicon area for the biasing circuit arrangement.

If the spread of the mixer stage operating current is to be minimized, it is desirable to have the reference bias current generated by a current reference circuit that uses a low-tolerance external resistor to determine the reference current. This generally means that a relatively low current reference cannot easily be used as a reference current input to a current mirror biasing an RF amplifier stage without noise and silicon area penalties.

OBJECTS AND SUMMARY OF THE INVENTION

According to a first aspect of this invention, there is provided an integrated circuit device including an amplifier stage which comprises a d.c. output current path including the second and third electrodes of at least a first transistor having first, second and third electrodes; a further transistor which is paired with the first transistor by having its first and second electrodes connected respectively to the first and second electrodes of the first transistor; and a biasing circuit arrangement operable with bias control feedback to determine a biasing level which sets the direct currents in the output current path and the said further transistor, which arrangement includes an input connected to sense the direct current at the third electrode of the said further transistor whereby the said biasing level is adjustable in response to the sensed current; wherein the third electrodes of the transistors are capacitively coupled together.

According to a second aspect of the invention, there is further provided an integrated circuit device including an amplifier stage which comprises: a pair of transistors each of which has a first electrode, a second electrode, and a third electrode which is an output electrode, wherein the first electrodes are connected together and the second electrodes are connected together; and a biasing circuit arrangement incorporating bias control feedback, which arrangement includes an input connected to sense the direct current at the third electrode of one of the pair of transistors, and output means connected to the first electrodes of the transistors, whereby the biasing level applied to the first electrodes is adjustable in response to the sensed current; wherein the third electrodes of the transistors are capacitively coupled together. Accordingly, in one of the simplest embodiments of the invention, the amplifier stage may comprise a single pair of transistors, one of which provides an input for a bias control feedback loop.

According to a third aspect of the invention, an integrated circuit device includes an amplifier stage which provides differential outputs and comprises: a plurality of pairs of transistors, wherein each of the transistors of each pair has a first electrode, a second electrode, and a third electrode which is an output electrode, and wherein, within each pair, the first electrodes are connected together and the second electrodes are connected together, and a biasing circuit arrangement incorporating bias control feedback, which arrangement includes at least one input connected to sense the direct current at the third electrode of a respective one of the said transistors, and a plurality of outputs each connected to the first electrodes of the transistors of a respective said pair of transistors, wherein the biasing level or levels applied to the first electrodes is or are adjustable in response to the sensed current or currents. An embodiment having these features has particular application as an integrated circuit RF mixer device in which the amplifier stage feeds a mixer stage having differential inputs.

From a fourth aspect, the invention further provides an integrated circuit device including: an amplifier stage which comprises two transistors each having three electrodes, two of said three electrodes of a first of the transistors being coupled to the respective same two electrodes of the second of the transistors, the respective third electrodes of each transistor being capacitively coupled such that at intended frequencies of operation the two transistors operate as one; and a biasing circuit arrangement providing DC biasing of the transistors, the biasing circuit arrangement including an input to sense the biasing of one of the transistors, whereby the DC biasing is adjustable in response to the sensed biasing.

Whether the amplifier stage has a single pair of transistors or two or more such pairs, it is preferable that the transistors of a pair are of different sizes of the integrated circuit semiconductor chip and that the respective input of the biasing circuit arrangement is coupled to the third electrode of the smaller transistor.

The third electrodes of the transistors of each pair are advantageous capacitively coupled together so that, at the frequencies of operation of the amplifier, the electrodes are substantially shorted to each other. Whether or not such capacitive coupling is present, the third electrode of the transistor of the pair which is not connected for DC purposes to the input of the biasing circuit is preferably used as a main output of the amplifier stage.

The transistors of the amplifier stage are preferably bipolar transistors, the first, second and third electrodes being respectively the bases, emitters, and collectors of the transistors. Transistors making up the biasing circuit arrangement are preferably field-effect transistor (PET) devices. However, the amplifier stage transistors and the biasing control arrangement transistors may be FETs and bipolar devices respectively.

The biasing circuit arrangement preferably includes current mirrors. Typically, the arrangement has a biasing control channel or feedback path for each pair of transistors of the amplifier stage, each channel containing at least one current mirror. It is conceivable, however, depending on the accuracy of biasing control required, to have a single control channel for plural pairs of transistors, Each control channel may include a current mirror coupled to a reference bias current source for comparing the level of a reference bias current from the reference bias current source with a signal representing the current drawn by the third electrode of the respective transistor of the amplifier stage transistor pair or pairs, A further current mirror may be included in each control channel for amplifying or attenuating the sensed current. Typically, where the channel includes two current mirrors, one is attached to one supply rail of the device and the other to a supply rail of opposite plurality so that the output of one current mirror may be used to feed the input of another current mirror directly, The comparator outputs are connected, in each case, to the first electrodes of the respective transistor pair, i.e. the base electrodes in the ease of the amplifier stage being constituted by bipolar transistors, via a respective resistance. Variations in the sensed current are compensated for by altering the supplied biasing level according to the output of the comparator. In this way, the second current is mirrored via the input current mirror and then, in the bias control circuit, the mirrored representation is compared to a reference current produced by the reference current source, and the comparison error is used to control the base voltage of the respective amplifier stage transistors via a biasing resistor.

In the case of the amplifier stage having two pairs of transistors fed from a single-ended signal input, the transistors of one pair may be connected as common base amplifiers, whilst the transistors of the other pair are connected as common-emitter amplifiers.

The term "amplifier stage" should be construed to include within its scope a buffer or a driver, as well as a circuit having negative gain or positive gain.

Additional objects and advantages of the invention will be set forth in part in the description that follows, and in part will be obvious from the description, or may be learned by practice of the invention. The objects and advantages of the invention may be realized and attained by means of the instrumentalities and combinations particularly pointed out in the appended claims.

The accompanying drawings, which are incorporated in and constitute a part of this specification, illustrate at least one presently preferred embodiment of the invention as well as some alternative embodiments. These drawings, together with the description, serve to explain the principles of the invention but by no means are intended to be exhaustive of all of the possible manifestations of the invention.

DETAILED DESCRIPTION OF THE PREFERRED EMBODIMENTS

Reference now will be made in detail to the presently preferred embodiments of the invention, one or more examples of which are illustrated in the accompanying drawings. Each example is provided by way of explanation of the invention, which is not restricted to the specifics of the examples. In fact, it will be apparent to those skilled in the art that various modifications and variations can be made in the present invention without departing from the scope or spirit of the invention. For instance, features illustrated or described as part of one embodiment, can be used on another embodiment to yield a still further embodiment. Thus, it is intended that the present invention cover such modifications and variations as come within the scope of the appended claims and their equivalents. The same numerals are assigned to the same components throughout the drawings and description.

Figure 1:
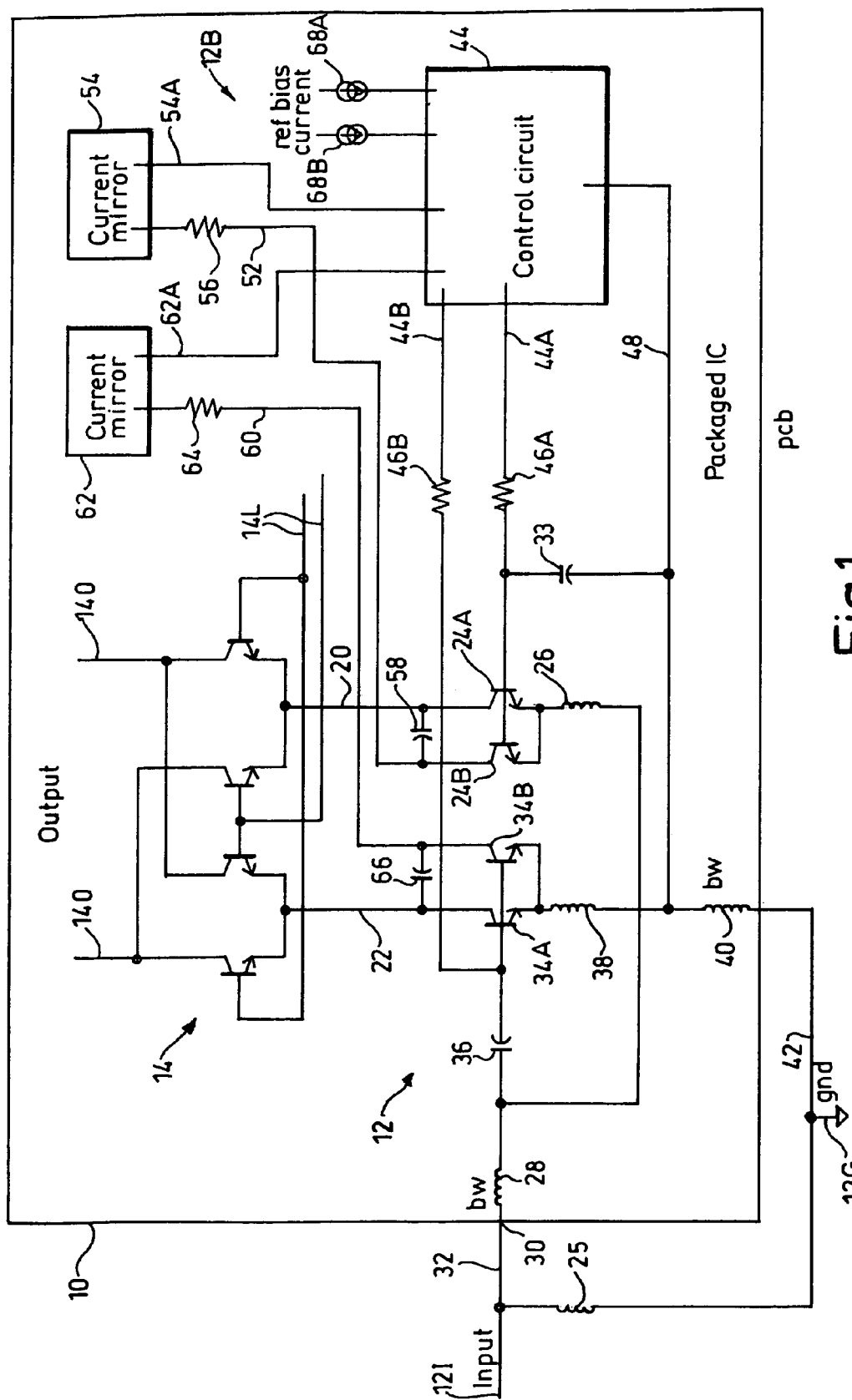
FIG. 1 is a simplified circuit diagram of a mixer device incorporating the invention.

Referring to FIG. 1, a radio frequency (RF) mixer device comprises an integrated circuit device 10 having an amplifier stage 12 with a single-ended input which includes an input terminal 12I, and a mixer stage 14 having differential local oscillator inputs 14L and differential outputs 14O. The mixer stage outputs 14O provide a DC supply feed path from a supply rail (not shown) to the mixer transistors and transistors of the amplifier stage 12. The supply voltage is typically 2.7V. The amplifier stage 12 includes a biasing circuit arrangement 12B.

The amplifier stage 12 has a common-base amplifier and a common-emitter amplifier which act as non-inverting and inverting amplifiers respectively to provide differential outputs on output lines 20, 22 which feed differential signal inputs of the mixer stage 14, The common-base amplifier comprises a pair of bipolar transistors 24A, 24B of which the base electrodes are connected together and of which the emitter electrodes are connected together. The transistors being connected in a common-base configuration, their emitter electrodes are coupled to the input terminal 12L This input terminal 12I is d.c. grounded via a choke inductance 25. The coupling includes a series inductance 26 which, in practice is a spiral inductor on the integrated circuit chip, and an impedance 28 constituted by a bonding wire between integrated circuit chip and an integrated circuit device terminal 30, as well as a printed circuit track 32 connected to the input terminal 12I. The track 32, like the bonding wire 28, forms a series impedance in the input path. A capacitor 33 de-couples the base electrodes of transistor 24A, 24B to ground for AC purposes. It will be seen that the common base amplifier has a direct current output path which includes the output line 20, the collector and emitter electrodes of transistor 24A and the inductances 26, 28 and 25.

The common-emitter amplifier has its own pair of transistors 34A, 34B. These transistors, like the transistors 24A, 24B of the common-base amplifier, have their base electrodes connected together and their emitter electrodes connected together. In this case, it is the base electrodes which are coupled to the input 12I, the coupling including a capacitor 36 and the bonding wire and printed circuit track impedances 28, 32 mentioned above. The emitters of the transistors 34A, 34B are coupled to an external ground connection 12G, forming the other side of the single-ended input to the amplifier stage, via an inductance 38 formed by an on-chip spiral inductor and via a bonding wire impedance 40 and a printed circuit track 42. The direct output current path in this case includes output line 22, the collector and emitter electrodes of the transistor 34A and inductances 38 and 40.

The connections between the emitters and between the bases of the paired transistors can include small impedances without substantial effect on the operation of the circuit.

Biasing currents for forward-biasing the base-emitter junctions of the transistors 24A, 24B, 34A, 34B are fed to the base electrodes from a bias control circuit 44 which has bias level outputs 44A, 44B each connected to the base electrodes of a respective transistor pair 24A, 24B; 34A, 34B via respective series resistances 46A, 46B. A DC biasing ground connection 48 runs to the control circuit 44 as a negative supply rail. Accordingly, the bias control circuit output 44A feeds a DC current path constituted by resistor 46A, transistors 24A, 24B, on-chip inductance 26, bonding wire impedance 28, the choke 25 constituted by an externally connected inductance, printed circuit tracks 32, 42, and bonding wire impedance 40. The other bias control circuit output 44B feeds resistor 46B, transistors 34A, 34B, and on-chip inductance 38. Depending on the construction of the bias control circuit 44, resistor 46A may be omitted, This resistor 46A and resistor 46B may be replaced by inductors.

From the above, it will be appreciated that the biasing of the transistors of the amplifier stage 12 is partly dependent on manufacturing variables resulting from the bonding wire impedances 28, 40 and on implementation variables arising from the PC board connections 32, 42 and the choke inductance 25. Bias stabilization is achieved by the splitting of the transistor amplifier portions of the amplifier stage 12 into the transistor pairs 24A, 24B; 34A, 34B. One transistor of each pair provides a sensing signal indicative of the biasing level of that pair, and the biasing circuit arrangement includes a feedback loop for adjusting the biasing level in response to the sensing signal. Accordingly, in this embodiment, the collector electrode of transistor 24B is connected to an input 52 of the biasing circuit arrangement 12B, which is connected to an input of a first current mirror 54 via a series connected resistor 56. The resistor 56 is a relatively high impedance at the frequencies of operation of the mixer stage 14. An inductor can be used instead as a high frequency blocking element. The collector electrode of the other transistor 24A of the relevant transistor pair is connected directly to the first differential output line 20 of the amplifier stage 12 to drive the mixer 14. In this embodiment the collector electrodes of the two transistors of the pair are coupled then by a capacitor 58 so that, for AC currents at the frequencies of operation, the collectors are effectively shorted together and the two transistors of the pair jointly amplify signals fed to the input 12I. This has the effect that, for the purposes of amplification at radio frequencies, the transistors 24A, 24B are not split, thereby avoiding the extra noise that would be generated by an effective long-tailed pair action if the capacitor were absent. (The capacitor cancels out the RF differential current of the pair, thereby canceling out the associated noise.) The high impedance represented by the input resistor 56 of the biasing circuit arrangement 12B encourages RF signals to flow via the capacitor 58 interconnecting the collector electrodes of the transistors 24A, 24B.

Similarly, a second input 60 of the biasing circuit arrangement is connected to the collector electrode of one of the transistors 34B of the other transistor pair 34A, 34B, and this input 60 feeds the input of a second current mirror 62 via a second series resistor 64 which, like resistor 56, is a high impedance at the operating frequencies. Again, an inductance may be used in place of the resistor 64, The other transistor 34A of the pair has its collector electrode connected directly to the other differential output line 22 of the amplifier stage 12 for feeding the mixer 14. Again, the collector electrodes of the transistors 34A, 34B are coupled together by a capacitor 66 which forms a low impedance at the frequencies of operation of the amplifier stage and mixer stage so that the two transistors of the pair operate as one to amplify the signals fed from the input 121 and to minimize noise.

In this embodiment, the transistors 24B, 34B of which the collector electrodes are coupled to the inputs 52, 60 of the biasing circuit arrangement are each smaller than the other transistor 24A, 34A of the respective pair in terms of their areas on the semiconductor chip, The input current mirrors 54, 62 produce output current signals on their outputs 54A, 62A which are proportional, in each case, to the current drawn by the transistor 24B, 34B of the respective transistor pair of the amplifier stage 12, These current signals are fed from the outputs 54A, 62A of the current mirrors 54, 62 to the bias control circuit 44 where they are used for adjusting the bias current levels fed to the transistor pair base electrodes from bias control circuit outputs 44A, 44B. The bias control circuit 44 has a pair of reference bias current sources 68A, 66B.

Figure 2:
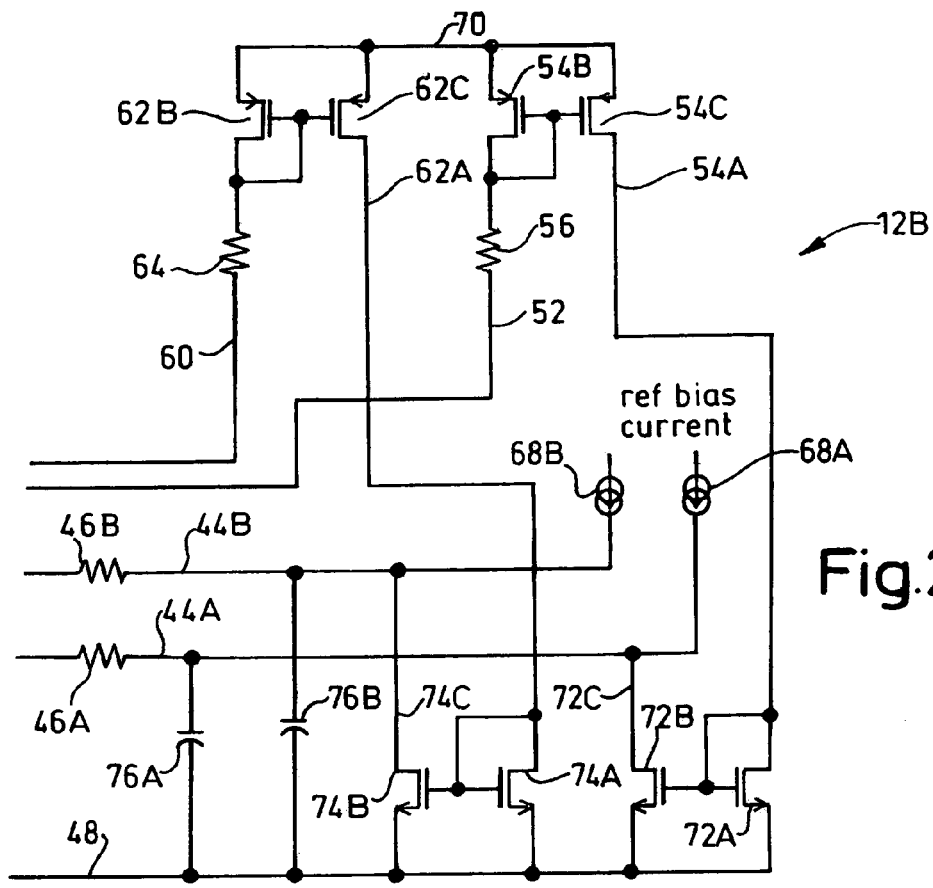
FIG. 2 is a circuit diagram of a biasing control arrangement in the mixer device of FIG. 1.

Referring to FIG. 2, the input current minors 54, 62 are each formed by a pair of CMOS field effect transistors (FETs) 54B, 54C; 62B, 62C, each connected together in conventional current mirror configuration with their source electrodes coupled to a positive supply rail 70, The sensing current signals on the output lines 54A, 62A of the current mirrors are fed to further current mirrors each formed by a further pair of CMOS FETs 72A, 72B; 74A, 74B connected, as shown, in conventional current mirror configuration with their outputs 72C, 74C connected to lines connecting the reference bias current sources 68A, 68B respectively to the bias control circuit outputs 44A, 44B, Each of the current mirrors forming part of the bias control circuit 44 are connected to the on-chip ground line 48; i.e. the source electrodes of the transistors of these current mirrors are connected to the ground line 48. Accordingly, the current minors 72A, 72B and 74A, 74B act as part of a circuit comparing the currents at the current mirror outputs 72C, 74C (which correspond to the current signals fed directly from the output lines 54A, 62A of the input current mirrors) with the levels of the currents generated by the reference bias current sources 68A, 68B The different currents resulting from the comparison are fed to the base electrodes of the amplifier stage transistors 24A, 24B; 34A, 34B, Shunt capacitors 76A, 76B connected across the bias control circuit output lines 44A, 44B and the ground line 48 stabilize the feedback loops created by the bias circuit arrangement by creating dominant integrator poles.

The size ratios of the transistor pairs of both the amplifier stage 12 (FIG. 1) and those of the current mirrors in the biasing circuit arrangement 12B can all be adjusted in the design stage to set appropriate DC bias currents for the transistors of the amplifier stage 12. In this way, not only does the circuitry described above with reference to FIGS. 1 and 2 compensate for variations in the DC voltage drop due to variations in bond wire and external impedances, but also a lower central current reference can be used, minimizing power consumption. The invention is not restricted to integrated circuit devices using bonding wires between the chip and the connection terminals. A device using so-called "flip-chip" packaging, in which an inverted chip is bonded directly to the terminal conductors can benefit from the invention as well. (Reference bias Currents are derived from a central biasing circuit which uses an external (i.e. off-chip) low-tolerance resistance).

Active control of the DC bias levels on the transistors 24A, 24B; 34A, 34B of the amplifier stage 12 is possible using logic control, for instance, to switch in or out different numbers of devices in the current mirrors. In this respect, it will be appreciated that references to pairs of transistors in the current mirrors are to be regarded not only as references to groups of interconnected transistors each having two interconnected transistors, but also to pairs of transistors in groups of more than two interconnected transistors. Thus, each current mirror may have three, four or five transistors, and so on.

In a similar fashion the transistors of the amplifier stage which receive the alternating (RF) input signals may be arranged as groups of interconnected transistors with interconnected first and second electrodes. Typically, where the amplifier has a group of three or more transistors with their first (base) electrodes connected together and their second (emitter) electrodes connected together, only one transistor in each group has its third (collector) electrode coupled to an input of the bias circuit arrangement. However, different numbers of transistors may be switched in and out to alter amplifier and bias control characteristics.

Figure 3:
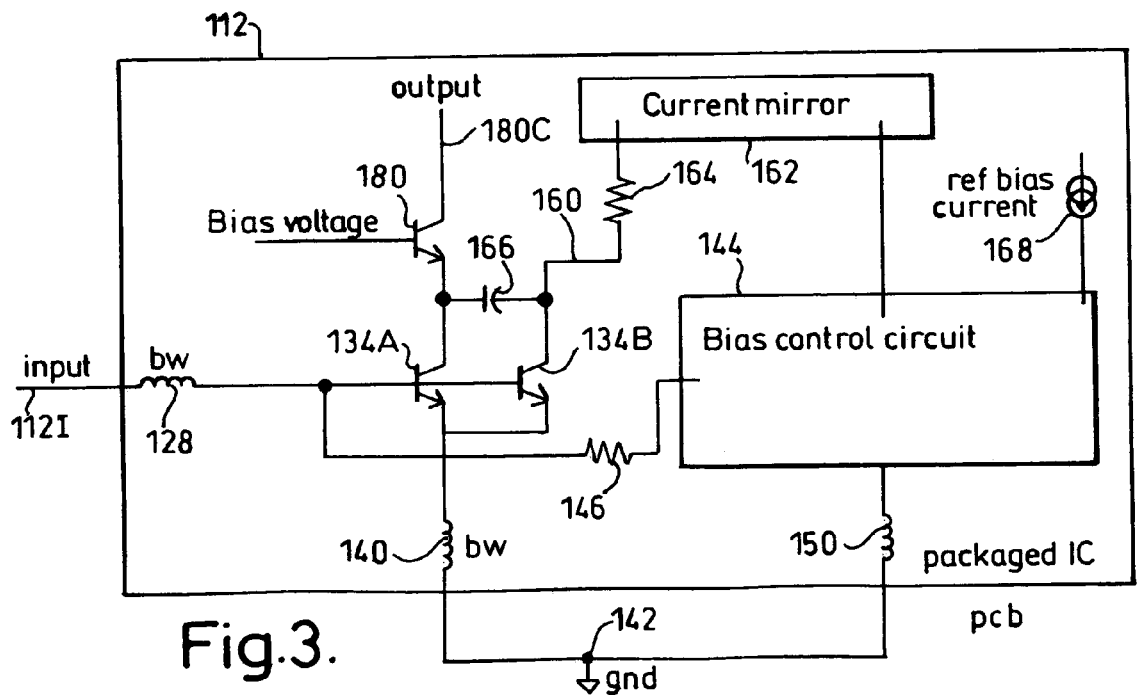
FIG. 3 is a simplified circuit diagram of a cascode amplifier device incorporating the invention.

The invention has application also to amplifier stages other than those having differential outputs. Referring to FIG. 3, for example, an integrated circuit device 112 operable as a low noise amplifier has a pair of transistors 134A, 134B connected in common-emitter configuration with their base electrodes connected together and their emitter electrodes connected together. The amplifier has an input 1121 which is coupled via the integrated circuit terminal 130 via bond wire 128 to the base electrodes of the transistors 134A, 134B, whilst the emitter electrodes are connected via a terminal-to-chip bond wire impedance 140 to an external ground connection 142. As in the differential amplifier stage example described above with reference to FIG. 1, the paired transistors are of different sizes. The collector electrode of the smaller transistor. 134B of the pair is coupled to a biasing circuit arrangement having an input connection 160 coupled via a relatively high resistance 164 to the input of an input current mirror 162 which, in turn, feeds a signal representative of the current in the collector of transistor 134B to a bias control circuit 144. In control circuit 144, that signal is compared to a reference current level from a reference bias current source 168 to provide a variable bias level to the base electrodes of transistors 134A, 134B via a series biasing resistor 146.

In this example, the bias control circuit 144 is separately grounded to the external ground line 142 via a terminal-to-chip bond wire impedance 150.

For the same reasons given above in relation to the amplifier stage of FIG. 1, the collector electrodes of the two transistors 134A, 134B are connected together by a capacitance which represents a low impedance at the frequencies of operation of the amplifier. The transistor 134A of the transistor pair 134A, 134B which is not connected to the biasing circuit arrangement has its collector electrode coupled to a third transistor 180 connected such that transistors 134A and 180 operate as a cascode pair with the output of the amplifier being made available on the collector electrode 180C of the third transistor. The output current path of the amplifier includes the collector and emitter electrodes of the third transistor 180, the collector and emitter electrodes of the larger transistor 134A of the paired transistors, and the bond wire inductance 140.

In this case, the output path of the bias control circuit 144 passes through biasing resistor 146, transistors 134A and 134B, the bond wire 140 connecting the transistor emitter electrodes to the external ground 142, the printed circuit board track connecting the integrated circuit terminal associated with bond wire 140 to the terminal associated with the bond wire 150 connecting the bias control circuit to the external ground 142, and the latter bond wire 150 itself. The feedback loop represented by the path between the collector electrode of the second transistor 134B of the transistor pair 134A, 134B, the current mirror 162 and the biasing control circuit 144 operates to stabilize the biasing level for the transistor pair despite variations in bond wire and external impedances. Again, a relatively low current reference source can be used, with an external resistor if required.

In an alternative embodiment, instead of transistors coupled to the input (134A, 134B in FIG. 3) being paired, the cascade output transistor 180 may be split into a pair of transistors having first (base) electrodes connected together and second (emitter) electrodes connected together. In this case, the third (collector) electrode of one of the paired transistors provides an alternating output signal (as does the output electrode of transistor 180 in FIG. 3) but the third (collector) electrode of the other transistor of the pair provides the (d.c. sensing current (I.e. rather than providing the sensing current from the collector of a transistor receiving the alternating signal input). As before, however, it is the biasing of the transistor or transistors associated with the signal input which is adjusted by the bias control circuit 144. Accordingly, the bias control circuit typically adjusts the biasing level on the base electrode of the transistor (or transistors) coupled to the signal input. analogous modification cart be made to the embodiment shown in FIG. 1.

A further modification may be made to the above described embodiments relating to the capacitive couplings (66 and S8 of FIG. 1; 166 of FIG. 3) of the pairs of transistors, so as to provide further embodiments. More particularly, in order to allow for a lower frequency of operation than would otherwise be the ease relying on an integrated circuit capacitive coupling, the capacitive coupling may be formed from an external component to the integrated circuit, such as, for example, an off-chip capacitor. This will allow the capacitive coupling to be of a larger capacitance, thereby allowing lower frequency of operation of the amplifier whilst maintaining the same effect as previously that the transistors of each pair operate as one to amplify the input signals.

While at least one presently preferred embodiment of the invention has been described using specific terms, such description is for illustrative purposes only, and it is to be understood that changes and variations may be made without departing from the spirit or scope of the following claims.

What is claimed is:

1. An integrated circuit device including an amplifier stage which comprises:
   a d.c. output current path including the second and third electrodes of at least a first transistor having first, second and third electrodes;
   a further transistor which is paired with the first transistor by having its first and second electrodes connected respectively to the first and second electrodes of the first transistor; and
   a biasing circuit arrangement operable with bias control feedback to determine a biasing level which sets the direct currents in the output current path and the said further transistor, which arrangement includes an input connected to sense the direct current at the third electrode of the said further transistor whereby the said biasing level is adjustable in response to the sensed current;
   wherein the third electrodes of the transistors are capacitively coupled together.

2. An integrated circuit device including an amplifier stage which comprises:
   a pair of transistors each of which has a first electrode, a second electrode, and a third electrode which is an output electrode, wherein the first electrodes are connected together and the second electrodes are connected together; and
   a biasing circuit arrangement incorporating bias control feedback, which arrangement includes an input connected to sense the direct current at the third electrode of one of the pair of transistors, and output means connected to the first electrodes of the transistors, whereby the biasing level applied to the first electrodes is adjustable in response to the sensed current;
   wherein the third electrodes of the transistors are capacitively coupled together.

3. A device according to claim 1, wherein the transistors of the pair are of different sizes on a semiconductor chip forming part of the device, and wherein the input of the biasing circuit arrangement is coupled to the third electrode of the smaller of the transistors.

4. A device according to claim 1, wherein the third electrode of the transistor which is not connected to the input of the biasing circuit arrangement constituting an output of the amplifier stage.

5. A device according to claim 2, wherein the second electrodes of the transistors are coupled via a series inductor to one of a pair of supply rails powering the amplifier stage.

6. A device according to claim 1, wherein the transistors are bipolar transistors, the first, second and third electrodes being the bases, emitters and collectors of the transistors respectively.

7. A device according to claim 1, wherein the biasing circuit arrangement comprises comparison means and a reference bias level source, wherein the comparison means are coupled to receive a signal representative of the said sensed current, to compare the signal with a reference bias level supplied by the reference bias level source, and thereby adjust the biasing level applied to the transistors to maintain the sensed current substantially constant.

8. A device according to claim 7, wherein the comparison means comprise at least one current mirror.

9. A device according to claim 8, wherein the biasing circuit arrangement comprises a first current mirror connected to the input of the biasing circuit arrangement, and a second current mirror connected to the first current mirror and to the reference bias level source to act as the comparison means, the first and second current mirrors being associated respectively with supply rails of opposite polarity.

10. A device according to claim 8, wherein each current mirror is implemented using field-effect transistors.

11. An integrated circuit device including an amplifier stage providing differential outputs and comprising:
    a plurality of pairs of transistors, wherein each of the transistors of each pair has a first electrode, a second electrode, and a third electrode which is an output electrode, and wherein, within each pair, the first electrodes are connected together and the second electrodes are connected together, and
    a biasing circuit arrangement incorporating bias control feedback, which arrangement includes at least one input connected to sense the direct current at the third electrode of a respective one of the said transistors, and a plurality of output means each connected to the first electrodes of the transistors of a respective said pair of transistors, wherein the biasing level or levels applied to the first electrodes is or are adjustable in response to the sensed current; and wherein the third electrodes of each pair of transistors are capacitively coupled together.

12. A device according to claim 11, wherein the biasing circuit arrangement has a plurality of inputs, one for each respective pair of transistors, each input being connected to the third electrode of one of the transistors of the respective pair.

13. A device according to claim 12, wherein the biasing circuit arrangement has a plurality of current mirrors, including at least one for each of the said pairs of transistors, and a plurality of reference bias level sources, the arrangement including a plurality of comparators each arranged to compare a signal representative of the respective said sensed current with a reference bias level supplied by the reference bias level sources thereby to adjust the biasing level applied to the respective pair of transistors.

14. A device according to claim 11, wherein the plurality of pairs of transistors include a first pair of bipolar transistors connected as a common-base amplifier and a second pair of bipolar transistors connected as a common-emitter amplifier, the amplifier stage having a single-ended input coupled to the first and second pairs.

15. An integrated circuit mixer device for radio frequency signals comprising a mixer stage having differential inputs and an amplifier stage according to claim 11 of which the differential outputs are connected to the mixer stage differential inputs.

16. A device according to claim 15, wherein each differential input of the mixer stage is connected to the output electrode of a transistor of a respective pair of the transistors of the amplifier stage, which transistor does not have its output electrode connected to the input of the biasing circuit arrangement.

17. A device according to claim 15, wherein the third electrodes of the transistors of each of the pairs of transistors are coupled together by a capacitance which acts as a substantial short circuit in the operating input frequency range of the mixer stage.

18. A device according to claim 15, in which the transistor pairs of the amplifier stage have series inductances in connections to the second electrodes, providing inductive degeneration.

19. An integrated circuit device including: an amplifier stage which comprises two transistors each having three electrodes, two of said three electrodes of a first of the transistors being coupled to the respective same two electrodes of the second of the transistors, the respective third electrodes of each transistor being capacitively coupled such that at intended frequencies of operation the two transistors operate as one; and a biasing circuit arrangement providing DC biasing of the transistors, the biasing circuit arrangement including an input to sense the biasing of one of the transistors, whereby the DC biasing is adjustable in response to the sensed biasing.

* * * * *